(12) United States Patent
McDevitt et al.

(10) Patent No.: US 8,088,690 B2
(45) Date of Patent: Jan. 3, 2012

(54) CMP METHOD

(75) Inventors: Thomas L. McDevitt, Underhill, VT (US); Graham M. Bates, Waterbury, VT (US); Eva A. Shah, Essex Junction, VT (US); Matthew T. Tiersch, Essex Junction, VT (US); Eric J. White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 374 days.

(21) Appl. No.: 12/415,406

(22) Filed: Mar. 31, 2009

(65) Prior Publication Data

US 2010/0248479 A1  Sep. 30, 2010

(51) Int. Cl.
*H01L 21/302* (2006.01)
*H01L 21/461* (2006.01)

(52) U.S. Cl. ........ 438/693; 438/689; 438/690; 438/691; 438/692; 216/88; 216/89

(58) Field of Classification Search ................ 216/88–89
See application file for complete search history.

(56) References Cited

U.S. PATENT DOCUMENTS

| | | | |
|---|---|---|---|
| 6,218,290 B1 | 4/2001 | Schonauer et al. | |
| 6,348,076 B1 * | 2/2002 | Canaperi et al. | 51/309 |
| 6,653,242 B1 * | 11/2003 | Sun et al. | 438/738 |
| 6,821,897 B2 | 11/2004 | Schroeder et al. | |
| 6,936,543 B2 | 8/2005 | Schroeder et al. | |
| 7,109,584 B2 | 9/2006 | Hershberger et al. | |
| 7,655,559 B2 * | 2/2010 | Kurashima et al. | 438/637 |
| 2004/0224521 A1 * | 11/2004 | Flake et al. | 438/692 |
| 2005/0227481 A1 | 10/2005 | Brase et al. | |
| 2009/0215269 A1 * | 8/2009 | Boggs et al. | 438/693 |

OTHER PUBLICATIONS

PCT International Application No. PCT/EP2010/052093, filed Feb. 19, 2010, International Search Report dated Apr. 8, 2010.

* cited by examiner

*Primary Examiner* — Parviz Hassanzadeh
*Assistant Examiner* — Margaret D Klunk
(74) *Attorney, Agent, or Firm* — Richard M. Kotulak; Hoffman Warnick LLC

(57) ABSTRACT

The instant invention is a method of polishing a substrate including contacting a substrate having at least one metal layer including copper with a chemical-mechanical polishing composition. The CMP composition includes an abrasive, a surfactant, an oxidizer, an organic acid including polyacrylic acid or polymethacrylic acid, a corrosion inhibitor, and a liquid carrier. A portion of the copper in the metal layer is abraded to polish the substrate. A second CMP composition contacts the abraded substrate, the second acrylate free composition including an abrasive, a surfactant, an oxidizer, and a corrosion inhibitor, and a liquid carrier. Any dendrites that may have formed on the substrate are removed through abrasion.

9 Claims, 3 Drawing Sheets

CMP METHOD

TECHNICAL FIELD

The disclosure relates methods of chemically-mechanically polishing (CMP) of substrates having a metal layer containing copper.

BACKGROUND OF THE INVENTION

Under some circumstances, dendrites and/or nanoparticles of conductive material may be formed between metal or other conductive material interconnects during fabrication of a semiconductor device. For example, where copper lines are formed by a damascene process, a polishing step is utilized to planarize the surface of the layer holding the damascene-formed lines. Typically, the polishing step involves a slurry or solution incorporating a grinding compound and/or chemical. The polishing process accordingly will produce small particles of the material being ground away which will remain suspended in the slurry. Consequently, the interconnect being polished will be immersed in a slurry having conductive particles suspended therein.

Under certain conditions, a voltage potential may appear across some or all of the interconnects. This voltage potential, in conjunction with chemical activity associated upon the interconnects in the slurry may cause a dendrite of conductive material to form on at least one of the interconnects. Additionally, such a dendrite may grow towards another interconnect and ultimately, make electrical contact with the other interconnect.

The interconnect towards which the dendrite grows will have a voltage potential opposite to the voltage potential of the interconnect producing the dendrite. The voltage potential on each interconnect driving the dendrite growth is produced by, for example, the structure of the device to which the interconnects are connected, and may not be necessarily directly related to the process at the device's surface.

A dendrite growth control circuit is disclosed in U.S. Pat. No. 7,109,584. This solution to control dendrite growth requires installation of an additional circuit in the semiconductor device.

U.S. Pat. No. 6,218,290 provides a solution to dendrite formation by chemically removing a portion of the surface of the semiconductor device after CMP.

SUMMARY

A method of polishing a substrate including contacting a substrate having at least one metal layer including copper with a chemical-mechanical polishing composition is disclosed. The CMP composition includes an abrasive, a surfactant, an oxidizer, an organic acid including polyacrylic acid or polymethacrylic acid, a corrosion inhibitor, and a liquid carrier. A portion of the copper in the metal layer is abraded to polish the substrate. A second CMP composition contacts the abraded substrate, the second composition includes an abrasive, a surfactant, an oxidizer, and a corrosion inhibitor, and a liquid carrier. The second composition is free of acrylates. Any dendrites that may have formed on the substrate are removed through abrasion.

An alternate method includes contacting and abrading a substrate including at least one metal layer including copper with a continuous supply of a chemical-mechanical polishing composition. The CMP composition initially includes an abrasive, a surfactant, an oxidizer, an organic acid including polyacrylic acid or polymethacrylic acid, a corrosion inhibitor, and a liquid carrier. The amount of organic acid is reduced to zero during the abrading whereby dendrite formation on the substrate is reduced.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure.

DETAILED DESCRIPTION

Embodiments of the invention relate to, for example, a method for minimizing or preventing dendrite growth between interconnects during semiconductor fabrication. Copper (Cu) interconnects formed by a damascene method, including a chemical-mechanical polishing (CMP) process, are susceptible to electrochemical reactions. Dendrite formation is an electrochemical redeposition of $Cu^{+2}$ ions on negatively charged sites. Modern CMP slurries employ organic acids containing acrylates to control CMP rates and selectivities of materials. Polymers adsorb to different materials at different concentrations, modifying surface potential and electrostatic interaction with the abrasive particles.

Figure 1:
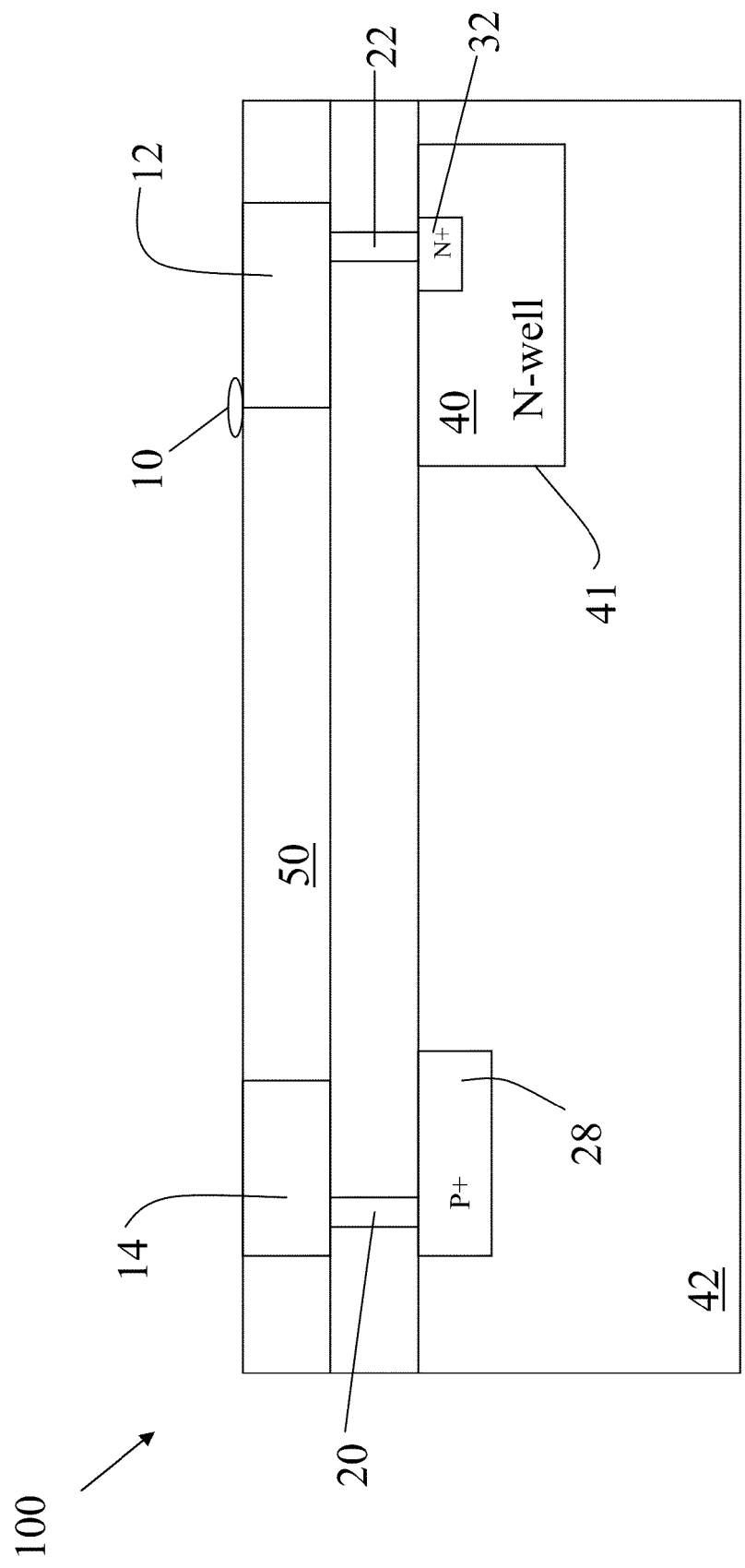
FIG. 1 is an illustration of a semiconductor device used to explain dendrite growth.

FIG. 1 is an illustration of a semiconductor device 100 and is used to explain the mechanism of dendrite growth. The semiconductor device 100 includes a substrate 42 having an N-well 40 therein. A $P^+$ contact 28 is formed in the substrate 42 and an $N^+$ contact 32 is formed in N-well 40 and substrate 42. A diffusion barrier layer, such as Ta or TaN, is shown as 50. Semiconductor device 100 includes a metal line 22 leading to an interconnect 12 is attached to $N^+$ contact 32. Interconnect 14 is attached to $P^+$ contact 28 through metal line 20. These features are all formed using standard fabrication processes as should be well known in the art, and, as such, a detailed discussion of the fabrication process is not required to understand and practice this invention.

In this and other examples, the semiconductor junction has a driving force equal to the potential difference between interconnect 14 and 12. Accordingly, charge is formed with negative charge being generated on the N-well 40 side of an interface 41 and positive charge being generated on substrate 42 side of interface 41. Negative charges may distribute themselves along current flow path which passes through N-well 40, $N^+$ contact 32, second metal line 20 to second interconnect 14. Additionally, the positive charges may be allowed to distribute themselves along the current flow path along substrate 42, $P^+$ contact 28, first metal line 22 and first interconnect 12. With charge being generated at the semiconductor junction 41, and being allowed to freely move along the current flow paths, opposite charges collect at the first and second interconnects, 12 and 14, respectively. With charge collected at the first and second interconnects, 12 and 14, a dendrite 10 may form on interconnect 12 while the semiconductor device is being polished. Dendrite 10 is formed by $Cu^{+2}$ ions precipitating out of the CMP solution at the negatively charged interconnect 12. Embodiments of the present invention provide a way to control this occurrence.

The following components are used in a CMP solution: an oxidizer, an abrasive, a surfactant, an organic acid, such as polyacrylic acid or polymethacrylic acid and a corrosion inhibitor. These components are dispersed in a liquid carrier. It has been found that polyacrylates of the organic acid promote formations of dendrites on metal/dielectric surfaces in the presence of an electrochemical driving force. Not to be bound by theory, it is thought that the CMP composition provides a polymeric layer containing $Cu^{+2}$ ions which accumulates on the surfaces of and provides the source for dendrite deposition and growth. This process is accelerated by a negative potential on the surface which attracts $Cu^{+2}$ ions and this attraction is stronger in the presence of a polyacrylic acid.

Embodiments of the instant invention include a method of polishing a substrate including contacting a substrate having at least one metal layer including copper with a chemical-mechanical polishing composition. The CMP composition includes an abrasive, a surfactant, an oxidizer, an organic acid including polyacrylic acid or polymethacrylic acid, a corrosion inhibitor, and a liquid carrier. A portion of the copper in the metal layer is abraded to polish the substrate. A second CMP composition contacts the abraded substrate, the second composition including an abrasive, a surfactant, an oxidizer, and a corrosion inhibitor, and a liquid carrier with no organic acid. Any dendrites that may have formed on the substrate are removed through abrasion. In a preferred embodiment the second CMP composition would be used between 10 and 20% of the total CMP process. The most preferred embodiment would be use of the second CMP composition for 15% of the total CMP process, based on time.

Figure 2:
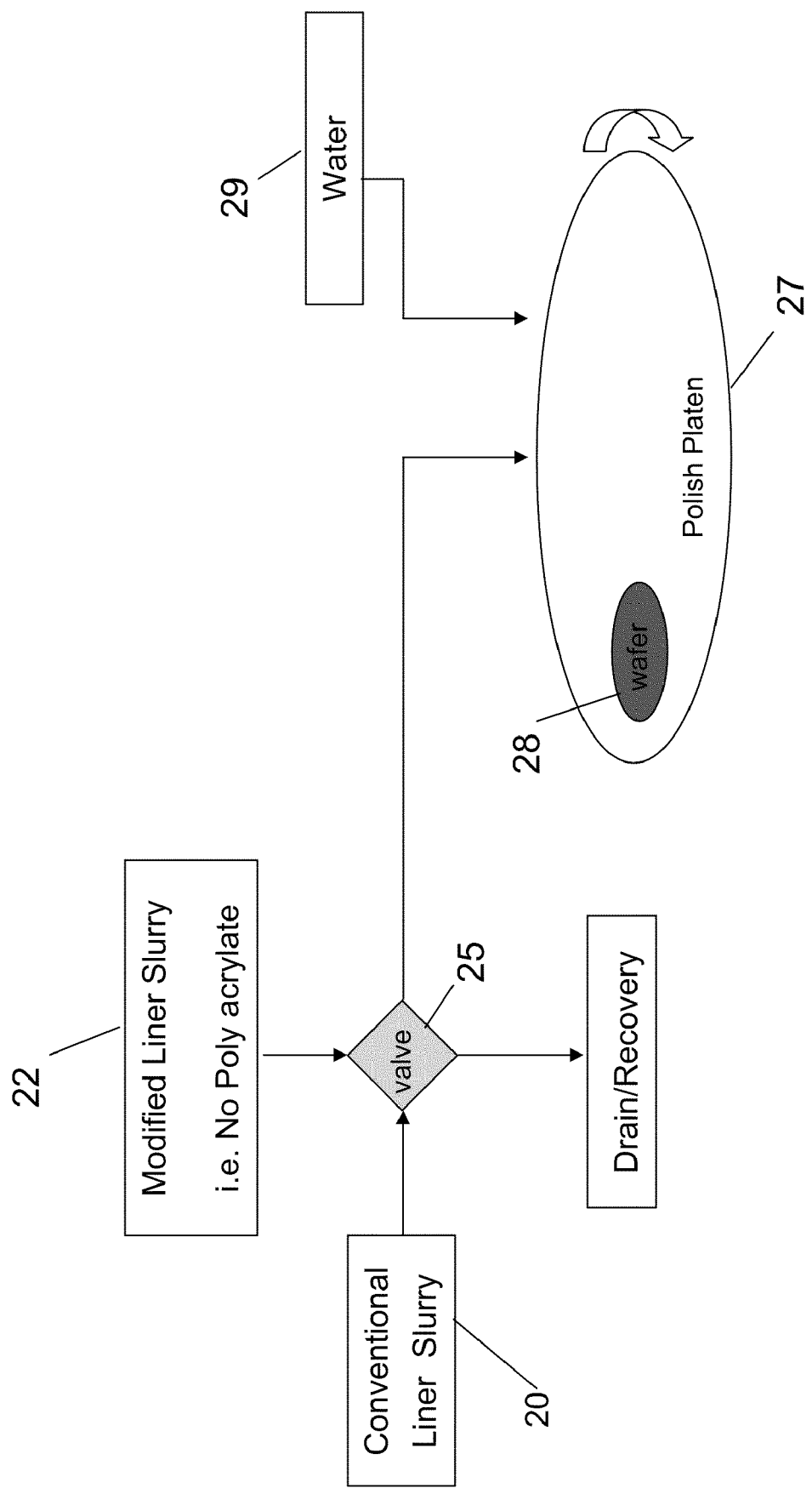
FIG. 2 is a schematic of representation of an embodiment of an apparatus used to implement the invention.

An alternate method of the present invention includes contacting and abrading a substrate including at least one metal layer including copper with a continuous supply of a chemical-mechanical polishing composition. FIG. 2 is a schematic representation of a way to implement this method. The CMP composition includes an abrasive, a surfactant, an oxidizer, an organic acid including polyacrylic acid or polymethacrylic acid, a corrosion inhibitor, and a liquid carrier. This composition is stored or supplied as shown by element 20. A second CMP composition which includes an abrasive, a surfactant, an oxidizer, a corrosion inhibitor, and a liquid carrier without an acrylate is stored or supplied by element 22. The amount of organic acid is reduced to zero during the abrading using valve 25 which switches the slurry delivery to a platen 27 from supply 20 to supply 22 for polishing the substrate or wafer 28. If desired, a water delivery line for additional water is shown in 29. Dendrite formation on the substrate is reduced using this method.

Embodiments of a CMP solution of the invention include an abrasive. The abrasive can be in any suitable form (e.g., abrasive particles). The abrasive is typically in particulate form and suspended in the liquid carrier. The abrasive as well as any other components suspended in the liquid carrier, form the polishing compositions of the CMP systems.

The abrasive typically has a mean primary particle size of about 100 nm or greater (e.g., about 105 nm or greater, about 110 nm or greater, or even about 120 nm or greater). Typically, the abrasive has a mean primary particle size of about 500 nm or less (e.g., about 250 nm or less, or even about 200 nm or less). Preferably, the abrasive has a mean primary particle size of about 100 nm to about 250 nm (e.g., about 105 nm to about 180 nm). The abrasive can be substantially free of aggregated abrasive particles such that the mean particle size is about the same as the mean primary particle size. The abrasive can be any suitable abrasive, for example, an inorganic metal oxide abrasive selected from the group consisting of alumina (e.g., α-alumina, γ-alumina, δ-alumina, and fumed alumina), silica (e.g., colloidally dispersed condensation-polymerized silica, precipitated silica, fumed silica), ceria, titania, zirconia, germania, magnesia, co-formed products thereof, and combinations thereof. The metal oxide abrasive can be electrostatically coated with an oppositely-charged polyelectrolyte. The abrasive also can comprise a cross-linked polymer abrasive. Preferably, the abrasive is a silica abrasive or a polyelectrolyte-coated alumina abrasive (e.g., polystyrenesulfonic acid-coated alumina abrasive).

Silica abrasives and polymer-coated alumina abrasives are particularly desirable when polishing soft metal layers such as copper which can easily be scratched by hard abrasives such as alumina abrasives. The abrasive typically has a mean primary particle size of about 20 nm or greater (e.g., about 30 nm or greater, or even about 50 nm or greater). The mean primary particle size preferably is about 1 micron or less (e.g., about 500 nm or less). The abrasive in the second embodiment additionally can have the characteristics of the abrasive in the first embodiment, and vice versa.

The abrasive described herein is colloidally stable. The CMP compositions typically include about 0.1 wt. % to about 20 wt. % (e.g., about 0.5 wt. % to about 15 wt. %, or about 1 wt. % to about 10 wt. %) abrasive, based on the weight of the liquid carrier and any components dissolved or suspended therein.

The surfactant of the CMP composition or solution in embodiments of this invention is used to promote wetting. For the purposes of this invention, surfactant can be sodium octyl sulfate, ammonium lauryl sulfate or sodium lauryl sulfate. The polishing systems typically comprise about 0.1 wt. % or less surfactant, based on the weight of the liquid carrier and any compounds dissolved or suspended therein. Preferably, the polishing system comprises about 0.001 wt. % to about 0.06 wt. % (e.g., about 0.01 wt. % to about 0.04 wt. %) surfactant, based on the weight of the liquid carrier and any compounds dissolved or suspended therein.

The chemical oxidizing agent can be any suitable oxidizing agent. Suitable oxidizing agents include inorganic and organic per-compounds, bromates, nitrates, chlorates, chromates, iodates, iron and copper salts (e.g., nitrates, sulfates, ethylenediaminetetraacetic acid (EDTA), and citrates), rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably includes hydrogen peroxide. The CMP composition typically includes about 0.1 wt. % to about 15 wt. % (e.g., about 0.2 wt. % to about 10 wt. %, about 0.5 wt. % to about 8 wt. %, or about 1 wt. % to about 5 wt. %) oxidizing agent, based on the weight of the liquid carrier and any compounds dissolved or suspended therein.

The organic acid in the initial CMP composition includes polyacrylic acid or polymethacrylic acid. The amount of organic acid used in the polishing system typically is about 0.01 to about 5 wt. %, preferably about 0.05 to about 3 wt. %.

The corrosion inhibitor (i.e., a film-forming agent) or passivant can be any suitable corrosion inhibitor. Typically, the corrosion inhibitor is an organic compound containing a heteroatom-containing functional group. For example, the corrosion inhibitor may include a heterocyclic organic compound with at least one 5- or 6-member heterocyclic ring as the active functional group, wherein the heterocyclic ring contains at least one nitrogen atom, for example, an azole compound. Preferably, the corrosion inhibitor includes a triazole; more preferably, 1,2,4-triazole, 1,2,3-triazole, or benzotriazole. The amount of corrosion inhibitor used in the polishing system typically is about 0.0001 to about 3 wt. %, preferably about 0.001 to about 2 wt. %.

A liquid carrier is used to facilitate the application of the abrasive and any components dissolved or suspended therein to the surface of a suitable substrate to be polished (e.g., planarized). The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

The polishing compositions can have any suitable pH, for example, the polishing compositions can have a pH of about 2 to about 12. Typically, the polishing compositions have a pH of about 3 or greater (e.g., about 5 or greater, or about 7 or greater) and a pH of about 12 or lower (e.g., about 10 or lower).

The CMP systems optionally can further comprise other components. Such other components may include, for example, complexing or chelating agents, biocides, anti-foaming agents, and the like.

The complexing or chelating agent is any suitable chemical additive that enhances the removal rate of the substrate layer being removed. Suitable chelating or complexing agents can include, for example, carbonyl compounds (e.g., acetylacetonates, and the like), di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). The choice of chelating or complexing agent will depend on the type of substrate layer being removed in the course of polishing a substrate with the polishing composition. The amount of complexing agent used in the polishing system typically is about 0.1 to about 10 wt. %, preferably about 1 to about 5 wt. %.

The biocide can be any suitable biocide, for example isothiazolinone biocide. The amount of biocide used in the polishing system typically is about 1 to about 50 ppm, preferably about 10 to about 20 ppm.

The anti-foaming agent can be any suitable anti-foaming agent. For example, the anti-foaming agent can be a polydimethylsiloxane polymer. The amount of anti-foaming agent present in the polishing system typically is about 40 to about 140 ppm.

The CMP composition optionally can further comprise one or more components such as pH adjusters, regulators, or buffers, and the like. Suitable pH adjusters, regulators, or buffers can include, for example, sodium hydroxide, potassium hydroxide, ammonium hydroxide, sodium carbonate, potassium carbonate, sulfuric acid, hydrochloric acid, nitric acid, phosphoric acid, citric acid, potassium phosphate, mixtures thereof, and the like.

Figure 3B:
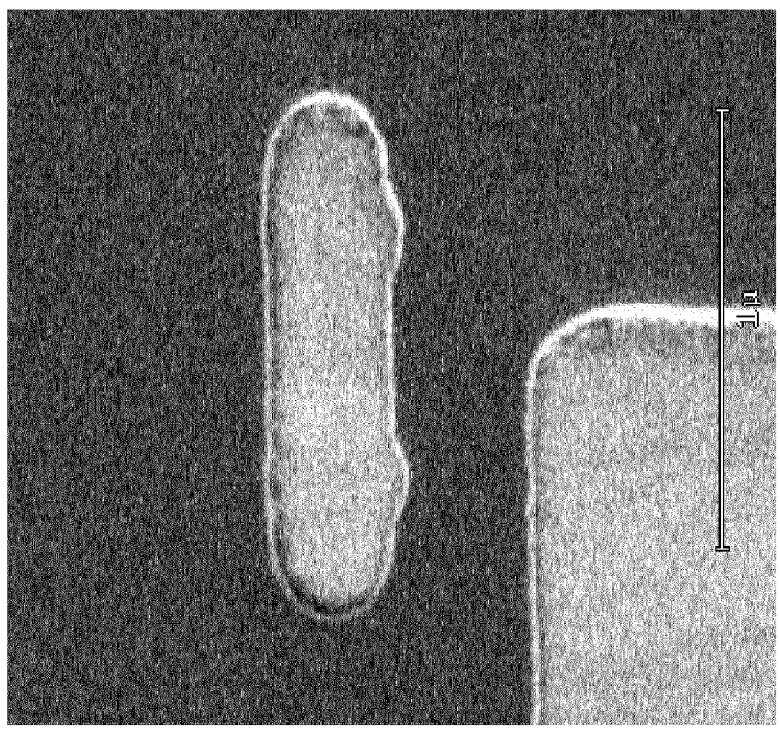
FIG. 3 (a) shows dendrite formation in a conventional CMP process, and FIG. 3 (b) shows dendrite formation in embodiments of the process of the present invention.
Figure 3A:
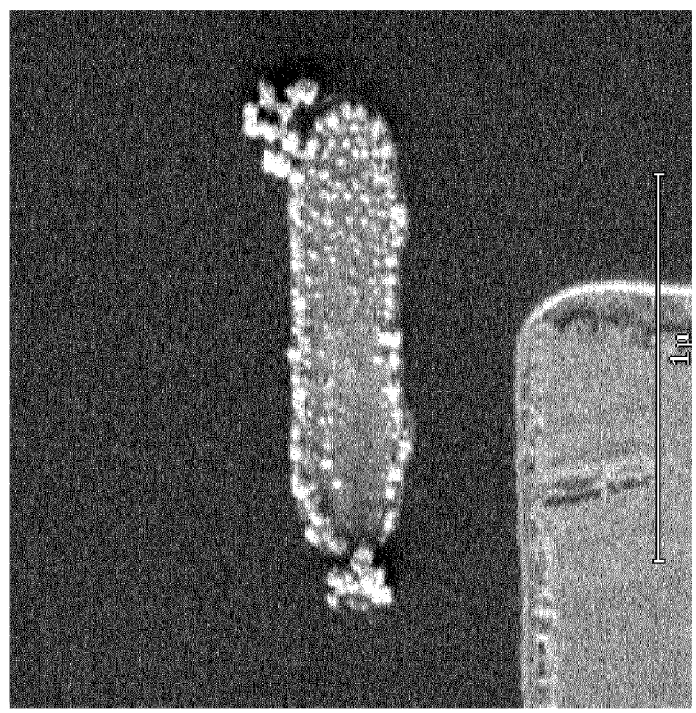

A conventional CMP process where a CMP composition of a corrosion inhibitor or passivant of benzotriazole, a surfactant, an oxidizer, an abrasive including a liquid carrier and an acrylate of polyacrylic acid was used to polish a substrate. As shown clearly in FIG. 3(a) dendrites or nanoparticles are apparent. After polishing with the initial CMP composition, a second CMP composition free of acrylate is used. FIG. 3(b) shows the same substrate polished using the two step process described and it is clear that dendrites are absent from the substrate.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of polishing a substrate comprising:
   (i) contacting a substrate comprising at least one metal layer comprising copper with a first chemical-mechanical polishing composition comprising: an abrasive, a surfactant, an oxidizer, an organic acid comprising polyacrylic acid or polymethacrylic acid, a corrosion inhibitor, and a liquid carrier;
   (ii) abrading at least a portion of the metal layer comprising copper to polish the substrate;
   (iii) contacting the abraded substrate from element (ii) with a second acrylate-free chemical-mechanical polishing composition comprising: an abrasive, a surfactant, an oxidizer, and a corrosion inhibitor, and a liquid carrier; and
   (iv) removing dendrites through abrasion that have formed on the substrate using the second acrylate-free chemical mechanical polishing composition.

2. The method of claim 1, wherein the abrasive in the first and second compositions is selected from the group consisting of alumina, silica, ceria, titania, zirconia, germania, magnesia and combinations thereof.

3. The method of claim 1, wherein the abrasive in the first and second compositions comprises a mean particle size 105 nm to about 180 nm.

4. The method of claim 1, wherein the surfactant in the first and second composition comprises sodium octyl sulfate, ammonium lauryl sulfate or sodium lauryl sulfate.

5. The method of claim 1, wherein the oxidizer in the first and second composition is selected from the group consisting of inorganic per-compounds, organic per-compounds, bromates, nitrates, chlorates, chromates, iodates, iron salts, copper salts, rare earth metal oxides, transition metal oxides, potassium ferricyanide, potassium dichromate and iodic acid.

6. The method of claim 1, wherein the liquid carrier of the first and second compositions comprises water.

7. The method of claim 1, wherein the corrosion inhibitor in the first and second composition is selected from the group consisting of benzotriazole, 6-tolyltriazole, 1,2,3-triazole, 1,2,4-triazole, and combinations thereof.

8. The method of claim 1, wherein the first composition has a pH of about 3 or greater.

9. The method of claim 1, wherein the contacting the abraded substrate from element (ii) with a second acrylate-free chemical-mechanical polishing composition comprises from between 10 and 20% of a total time of the method.

* * * * *